(12) United States Patent
Jinbo et al.

(10) Patent No.: US 9,202,929 B2
(45) Date of Patent: Dec. 1, 2015

(54) THIN FILM TRANSISTOR AND METHOD FOR MANUFACTURING THE SAME

(75) Inventors: Yasuhiro Jinbo, Kanagawa (JP); Hideomi Suzawa, Kanagawa (JP); Hiromichi Godo, Kanagawa (JP); Shinya Sasagawa, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 452 days.

(21) Appl. No.: 12/972,859

(22) Filed: Dec. 20, 2010

(65) Prior Publication Data

US 2011/0147744 A1 Jun. 23, 2011

(30) Foreign Application Priority Data

Dec. 21, 2009 (JP) ................. 2009-289840

(51) Int. Cl.
*H01L 29/786* (2006.01)
*H01L 29/66* (2006.01)

(52) U.S. Cl.
CPC .... *H01L 29/78696* (2013.01); *H01L 29/66765* (2013.01); *H01L 29/786* (2013.01); *H01L 29/78663* (2013.01)

(58) Field of Classification Search
CPC ............ H01L 29/786; H01L 29/78663; H01L 29/78696
USPC ......................................... 257/57–61, 66–72
See application file for complete search history.

(56) References Cited

U.S. PATENT DOCUMENTS

| 5,075,746 A | 12/1991 | Hayashi et al. |
| 6,756,258 B2 | 6/2004 | Zhang et al. |
| 7,622,785 B2 | 11/2009 | Sasagawa et al. |
| 7,791,154 B2 | 9/2010 | Sasagawa et al. |
| 8,035,103 B2 | 10/2011 | Kimura |
| 8,624,321 B2 | 1/2014 | Yamazaki et al. |
| 2008/0044962 A1 | 2/2008 | Zhang et al. |
| 2009/0002591 A1 | 1/2009 | Yamazaki et al. |
| 2009/0061573 A1* | 3/2009 | Miyairi et al. ............... 438/160 |
| 2009/0218576 A1* | 9/2009 | Dairiki et al. ................ 257/72 |
| 2010/0276773 A1 | 11/2010 | Sasagawa et al. |

FOREIGN PATENT DOCUMENTS

| EP | 0354372 A | 2/1990 |
| JP | 02-030186 A | 1/1990 |
| JP | 11-154752 A | 6/1999 |
| JP | 11-233781 A | 8/1999 |
| JP | 2000-349293 A | 12/2000 |
| JP | 2009-044134 A | 2/2009 |
| JP | 2009-260277 A | 11/2009 |
| WO | WO-2007/017982 | 2/2007 |

\* cited by examiner

*Primary Examiner* — Colleen Matthews
*Assistant Examiner* — William Harriston
(74) *Attorney, Agent, or Firm* — Fish & Richardson P.C.

(57) ABSTRACT

An object is to increase the on-state current of a thin film transistor. A solution is to provide a projection in a back-channel portion of the thin film transistor. The projection is provided so as to be off a tangent in the back-channel portion between a source or a drain and a channel formation region. With the projection, a portion where electric charge is trapped and a path of the on-state current can be apart from each other, so that the on-state current can be increased. The shape of a side surface of the back-channel portion may be curved, or may be represented as straight lines in a cross section. Further, a method for forming such a shape by performing one etching step is provided.

22 Claims, 18 Drawing Sheets

THIN FILM TRANSISTOR AND METHOD FOR MANUFACTURING THE SAME

BACKGROUND OF THE INVENTION

1. Field of the Invention

The present invention relates to thin film transistors and methods for manufacturing the thin film transistors. The present invention further relates to display devices and electronic devices which include the thin film transistors and to which the methods for manufacturing the thin film transistors can be applied.

2. Description of the Related Art

In recent years, thin film transistors (TFTs) each including a thin semiconductor film (with a thickness of greater than or equal to approximately several nanometers and less than or equal to several hundreds of nanometers) over a substrate having an insulating surface (e.g., a glass substrate) have been attracting attention. The development of TFTs, for example, as switching elements of a display device such as a liquid crystal display device and the like has been accelerated. For the TFTs, an amorphous semiconductor or a polycrystalline semiconductor is mainly used. Further, TFTs in which a microcrystalline semiconductor is used are also known (e.g., Patent Document 1). In a display device, the switching characteristic of the mounted TFTs has influence on a display quality and power consumption.

One of the parameters that determine the switching characteristic of the TFT is an on/off ratio of current. In order to increase the on/off ratio of current, on-state current may be increased and off-state current may be decreased.

Note that "on/off ratio" in this specification means a ratio of the on-state current to the off-state current of a TFT. The "off-state current" means a current flowing between a source and a drain when the TFT is in an off-state while the "on-state current" means a current flowing between the source and the drain when the TFT is in an on-state.

REFERENCE

Patent Document

[Patent Document 1] Japanese Published Patent Application No. 2009-044134

SUMMARY OF THE INVENTION

It is an object of one embodiment of the present invention to provide a TFT with a high on-state current and a high on/off ratio.

It is another object of one embodiment of the present invention to provide a method for simply manufacturing the TFT with a high on-state current and a high on/off ratio.

In one embodiment of the present invention, a semiconductor layer included in an insulated-gate transistor has a structure which alleviates an electric field between a source and a drain. That is, a step portion (a projection) is provided in a back-channel portion of the transistor. By providing the step portion (the projection) in the semiconductor layer, the concentration of an electric field in the back-channel portion is alleviated.

Note that in this specification, the "back-channel portion" means a portion of a semiconductor layer which exists between the source and the drain on a side opposite to a gate electrode and a gate insulating layer.

One embodiment of the present invention is a thin film transistor including a semiconductor layer which includes a curved surface at least in a part and is provided with a back-channel portion, wherein the back-channel portion includes a step portion. In a cross section, all tangents to the curved surface included in the semiconductor layer in the back-channel portion between a source or a drain in the semiconductor layer and a channel are off the step portion.

Another embodiment of the present invention is a thin film transistor including a semiconductor layer a part of which serves as a channel formation region; and a semiconductor layer between a source and a drain, which includes a curved surface at least in a part, is provided with a back-channel portion, and serves as a buffer layer, wherein the back-channel portion includes a step portion. In a cross section, all tangents to the curved surface included in the semiconductor layer in the back-channel portion between the source or the drain in the semiconductor layer and the channel formation region are off the step portion.

In the thin film transistor having the above-described structure, all the tangents to the curved surface included in the semiconductor layer are preferably off an edge of the step portion.

Another embodiment of the present invention is a thin film transistor including a semiconductor layer which includes a channel formation region, and includes at least a first side surface, a second side surface, and a third side surface. In a cross section, the second side surface is provided between the first side surface and the third side surface, and the taper angle of the first side surface, the taper angle of the second side surface, and the taper angle of the third side surface are different from one another.

Another embodiment of the present invention is a thin film transistor including a semiconductor layer a part of which serves as a channel formation region, and a semiconductor layer which serves as a buffer layer between a source and a drain, wherein the buffer layer includes at least a first side surface, a second side surface, and a third side surface. In a cross section, the second side surface is provided between the first side surface and the third side surface, and the taper angle of the first side surface, the taper angle of the second side surface, and the taper angle of the third side surface are different from one another.

Another embodiment of the present invention is a thin film transistor including a semiconductor layer a part of which serves as a channel formation region, and a semiconductor layer which serves as a buffer layer between a source and a drain, wherein the buffer layer includes at least a first side surface, a second side surface, and a third side surface. In a cross section, the second side surface is provided between the first side surface and the third side surface, and among the taper angle of the first side surface, the taper angle of the second side surface, and the taper angle of the third side surface, only the taper angle of the second side surface is different.

Another embodiment of the present invention is a thin film transistor including a semiconductor layer a part of which serves as a channel formation region, and a semiconductor layer which serves as a buffer layer between a source and a drain, wherein the buffer layer includes at least a first side surface, a second side surface, and a third side surface, and wherein the first side surface, the second side surface, and the third side surfaces are curved surfaces. In a cross section, the second side surface is provided between the first side surface and the third side surface, and either or both radii of curvature or/and the centers of circles that determine curvature of the first side surface, the second side surface, and the third side surface, are different from one another.

Another embodiment of the present invention is a thin film transistor including a semiconductor layer a part of which serves as a channel formation region, and a semiconductor layer which serves as a buffer layer between a source and a drain, wherein the buffer layer includes at least a first side surface and a second side surface, and wherein the first and second side surfaces are curved surfaces. In a cross section, either or both radii of curvature or/and the centers of circles that determine curvature of the first side surface and the second side surface are different from each other.

Note that in this specification, a "film" means a film which is formed over the entire surface of an object by a CVD method (including a plasma CVD method and the like), a sputtering method, or the like. On the other hand, a "layer" means a layer which is formed by processing a "film" or a layer which is formed over the entire surface of an object and which does not need to be subjected to processing.

With a TFT which is one embodiment of the present invention, a TFT with a high on-state current and a high on/off ratio can be obtained.

With a method for manufacturing a TFT which is one embodiment of the present invention, a TFT with a high on-state current and a high on/off ratio can be simply manufactured.

DETAILED DESCRIPTION OF THE INVENTION

Figure 1:
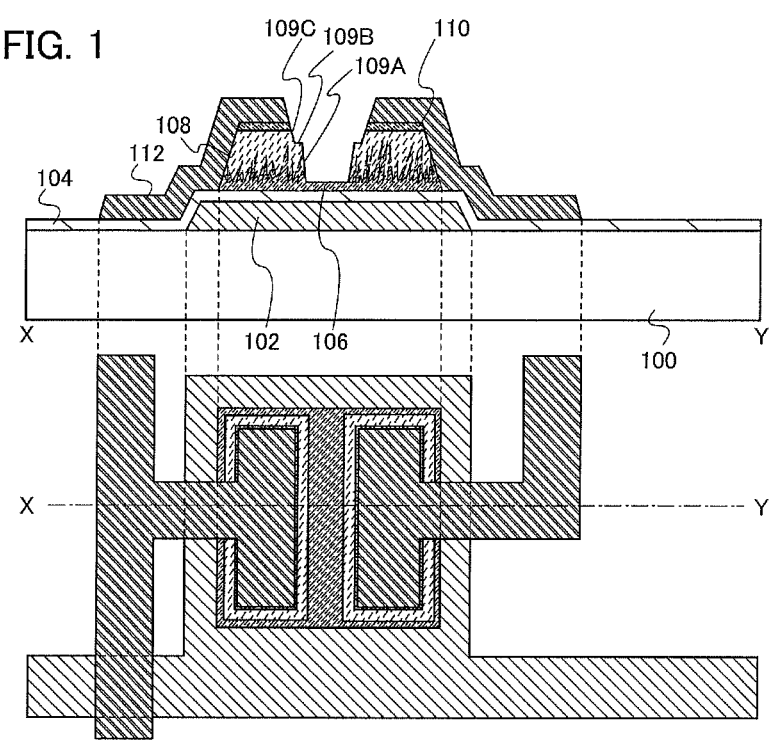
FIG. 1 is a cross-sectional view and a top view illustrating a TFT of Embodiment 1.

Hereinafter, embodiments of the present invention will be described in detail with reference to the accompanying drawings. However, the present invention is not limited to the following description and it is easily understood by those skilled in the art that the mode and details can be variously changed without departing from the scope and spirit of the present invention. Accordingly, the invention should not be construed as being limited to the description of the embodiments below. In describing structures of the present invention with reference to the drawings, the same reference numerals are used in common for the same portions in different drawings. The same hatching pattern is applied to similar portions, and the similar portions are not especially denoted by reference numerals in some cases. In addition, an insulating layer is not illustrated in a top view in some cases.

(Embodiment 1)

In this embodiment, examples of TFTs which is one embodiment of the present invention will be described.

In FIG. 1, a cross-sectional view and a top view of a TFT of this embodiment are illustrated. Note that the cross-sectional view is taken along X-Y in the top view. The TFT illustrated in FIG. 1 is provided over a substrate 100 and includes a first wiring layer 102; an insulating layer 104 that covers the first wiring layer 102; a first semiconductor layer 106 an entire surface of which overlaps with the first wiring layer 102; second semiconductor layers 108 that are on and in contact with the first semiconductor layer 106, provided with a space, and have lower carrier mobility than the first semiconductor layer 106; impurity semiconductor layers 110 that are in contact with the second semiconductor layers 108; and second wiring layers 112 that are in contact with at least the impurity semiconductor layers 110. A back-channel portion in the second semiconductor layer 108 includes a step portion.

That is, the TFT illustrated in FIG. 1 includes the first semiconductor layer 106 a part of which serves as a channel formation region, and the second semiconductor layer 108 that serves as a buffer layer between a source and a drain. The second semiconductor layer 108 includes a first side surface 109A, a second side surface 109B, and a third side surface 109C. The second side surface 109B is provided between the first side surface 109A and the third side surface 109C. The taper angle of the first side surface 109A, the taper angle of the second side surface 109B, and the taper angle of the third side surface 109C are different from each other.

Note that without limitation to the above, the taper angle of the first side surface 109A and the taper angle of the third side surface 109C may be the same. That is, the first side surface 109A and the third side surface 109C may be parallel to each other.

Note that in this specification, a taper angle means, in a layer having a tapered shape, an inclination angle (an interior angle) between a side surface of the layer and a surface of a substrate.

Although a mode in which the taper angle of the first side surface 109A is larger than the taper angle of the third side surface 109C is shown in FIG. 1, without limitation to this mode, the taper angle of the first side surface 109A may be smaller than the taper angle of the third side surface 109C.

Although a mode in which the taper angle of the second side surface 109B is almost 0° is shown in FIG. 1, without limitation to this mode, the taper angle of the second side surface 109B may be a given angle.

A variety of modes of the back-channel portion in the second semiconductor layer 108 will be discussed here. FIGS. 18A to 18F show all of the modes when a taper angle α of the first side surface, a taper angle β of the second side surface, and a taper angle γ of the third side surface are different from one another.

Figure 18A:
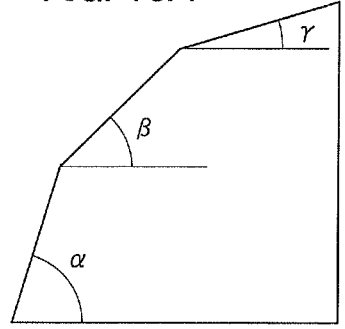
FIGS. 18A to 18F each illustrate a side surface of a back-channel portion of the TFT in FIG. 1.

In FIG. 18A, a mode in which the taper angle α of the first side surface is the largest and the taper angle γ of the third side surface is the smallest is shown. That is, the mode of α>β>γ is shown.

Figure 18B:
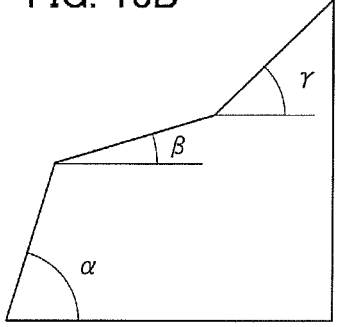

In FIG. 18B, a mode in which the taper angle α of the first side surface is the largest and the taper angle β of the second side surface is the smallest is shown. That is, the mode of α>γ>β is shown.

Figure 18C:
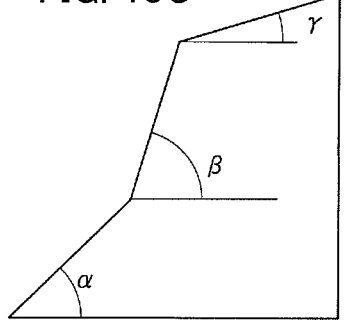

In FIG. 18C, a mode in which the taper angle β of the second side surface is the largest and the taper angle γ of the third side surface is the smallest is shown. That is, the mode of β>α>γ is shown.

Figure 18D:
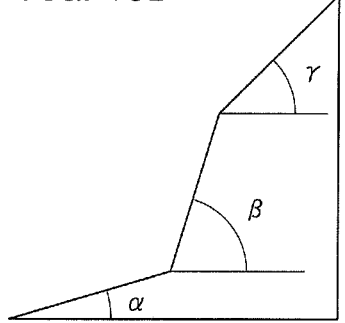

In FIG. 18D, a mode in which the taper angle β of the second side surface is the largest and the taper angle α of the first side surface is the smallest is shown. That is, the mode of β>γ>α is shown.

Figure 18E:
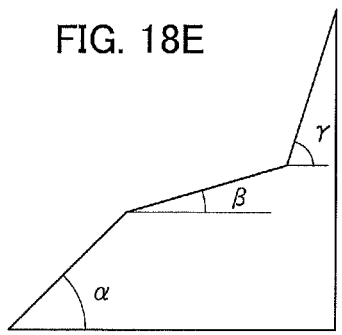

In FIG. 18E, a mode in which the taper angle γ of the third side surface is the largest and the taper angle β of the second side surface is the smallest is shown. That the mode of γ>α>β is shown.

Figure 18F:
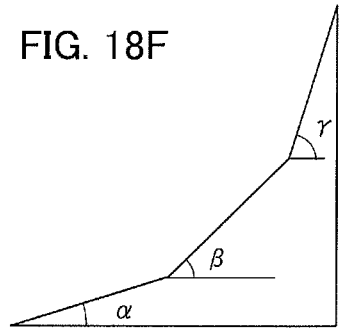

In FIG. 18F, a mode in which the taper angle γ of the third side surface is the largest and the taper angle α of the first side surface is the smallest is shown. That is, the mode of γ>β>α is shown.

In the TFT of this embodiment, the back-channel portion in the second semiconductor layer 108 preferably has a shape shown in any of FIG. 18B, FIG. 18C, FIG. 18D, and FIG. 18E.

Although the cross-sectional view in FIG. 1 shows only a mode in which the side surfaces of the back-channel portion in the second semiconductor layer 108 are expressed as straight lines, without limitation to this mode, the side surfaces of the second semiconductor layer may be curved surfaces. Further, the number of the side surfaces of the second semiconductor layer may be two instead of three.

Figure 2:
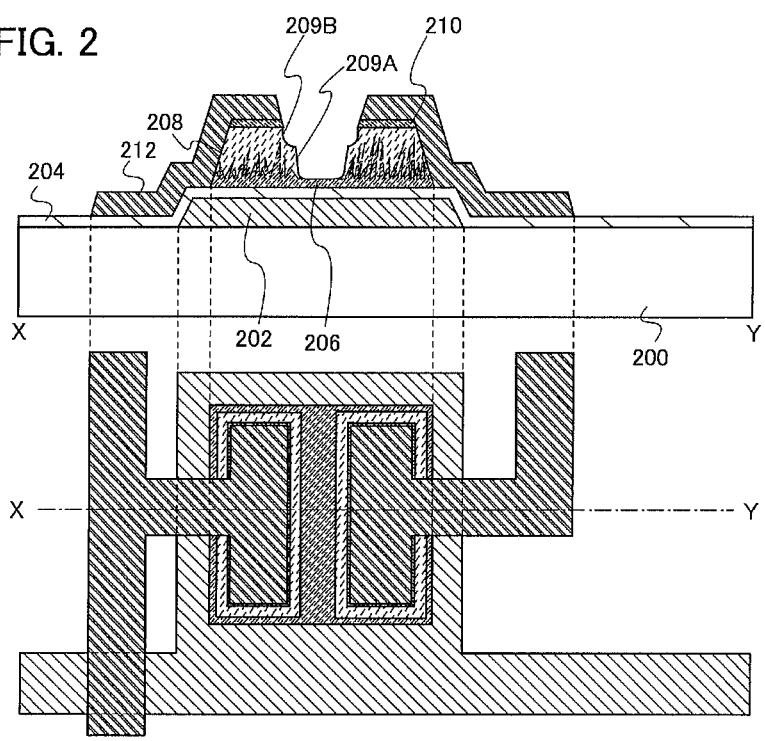
FIG. 2 is a cross-sectional view and a top view illustrating a TFT of Embodiment 1.

In FIG. 2, a mode in which the side surfaces of the second semiconductor layer include curved surfaces is shown. A TFT illustrated in FIG. 2 is provided over a substrate 200 and includes a first wiring layer 202; an insulating layer 204 that covers the first wiring layer 202; a first semiconductor layer 206 an entire surface of which overlaps with the first wiring layer 202; second semiconductor layers 208 that are on and in contact with the first semiconductor layer 206, provided with a space, and have lower carrier mobility than the first semiconductor layer 206; impurity semiconductor layers 210 that are in contact with the second semiconductor layers 208; and second wiring layers 212 that are in contact with at least the impurity semiconductor layers 210. A back-channel portion in the second semiconductor layer 208 includes a plurality of curved side surfaces.

That is, the TFT illustrated in FIG. 2 includes the first semiconductor layer 206 a part of which serves as a channel formation region, and the second semiconductor layer 208 that serves as a buffer layer between a source and a drain. The second semiconductor layer 208 includes at least a first side surface 209A, a second side surface 209B. The first side surface 209A and the second side surface 209B have curved surfaces. The center of a circle that determines the curvature of the first side surface 209A and the center of a circle that determines the curvature of the second side surface 209B are different from each other. Further, the curvature radii are preferably different from each other.

Figure 17A:
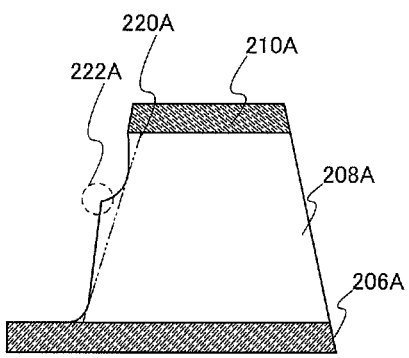
FIGS. 17A to 17C each illustrate a side surface of a back-channel portion of the TFT in FIG. 1.
Figure 17B:
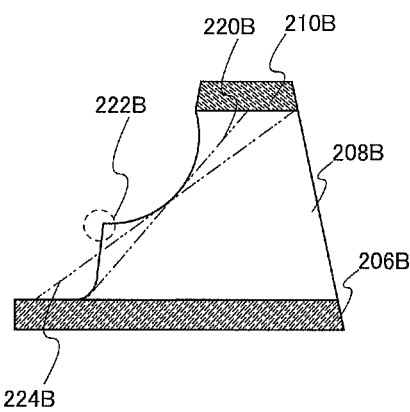

In FIGS. 17A and 17B, only the first semiconductor layer 206, the second semiconductor layer 208, and the impurity semiconductor layer 210 in the TFT in FIG. 2 are selectively illustrated. In FIG. 17A, the first semiconductor layer 206 is expressed as a first semiconductor layer 206A, the second semiconductor layer 208 is expressed as a second semiconductor layer 208A, and the impurity semiconductor layer 210 is expressed as an impurity semiconductor layer 210A. In FIG. 17B, the first semiconductor layer 206 is expressed as a first semiconductor layer 206B, the second semiconductor layer 208 is expressed as a second semiconductor layer 208B, and the impurity semiconductor layer 210 is expressed as an impurity semiconductor layer 210B.

In FIG. 17A, a back-channel portion is provided with a step portion 222A. A tangent 220A between the impurity semiconductor layer 210A and the first semiconductor layer 206A a part of which serves as a channel formation region is off an edge of the step portion 222A. The tangent 220A is included in the second semiconductor layer 208A in which the back-channel portion is provided. Further, the tangent 220A is included in the second semiconductor layer 208A in which the back-channel portion is provided and is the tangent which is the closest to the edge of the step portion 222A. Since the tangent 220A is off the edge of the step portion 222A, on-state current can be increased. This is because a distance is secured between the edge of the step portion 222A where charge is concentrated and a path through which the on-state current can flow.

In FIG. 17B, the shape of the back-channel portion is different from that in FIG. 17A. However, as in FIG. 17A, a tangent 220B between the impurity semiconductor layer 210B and the first semiconductor layer 206B a part of which serves as a channel formation region is off an edge of a step portion 222B. The tangent 220B is included in the second semiconductor layer 208B in which the back-channel portion is provided. Further, the tangent 220B is included in the second semiconductor layer 208B in which the back-channel portion is provided and is the tangent which is the closest to the edge of the step portion 222B. Since the tangent 220B is off the edge of the step portion 222B, on-state current can be increased. This is because a distance is secured between the edge of the step portion 222B where charge is concentrated and a path through which the on-state current can flow.

Note that a tangent 224B in FIG. 17B is not wholly included in the second semiconductor layer 208B in which the back-channel portion is provided, and such a tangent is not taken into consideration.

Figure 17C:
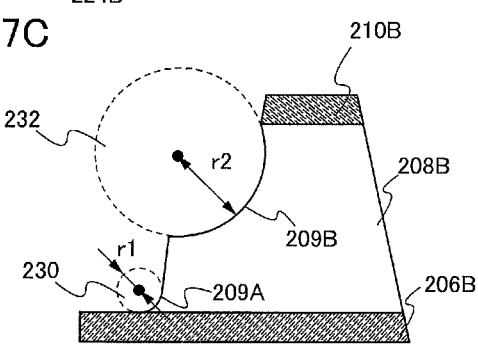

The structure illustrated in FIG. 17C is the same as that in FIG. 17B. In FIG. 17C, a circle 230 that determines the curvature of the first side surface 209A and a circle 232 that determines the curvature of the second side surface 209B are illustrated. The circle 230 has a radius r1 and the circle 232 has a radius r2.

In FIG. 17C, the center of the circle 230 and the center of the circle 232 do not coincide with each other, and the length of the radius r1 and the length of the radius r2 are different from each other (r1≠r2). However, without limitation to the above, and the radius r1 and the radius r2 may be the same (r1=r2). In the case where the radius r1 and the radius r2 are the same, the center of the circle 230 and the center of the circle 232 do not coincide with each other and a certain distance needs to be secured therebetween. Note that the distance between the center of the circle 230 and the center of the circle 232 is preferably larger than the sum of the radius r1 of the circle 230 and the radius r2 of the circle 232.

Each layer in the TFT illustrated in FIG. 1 will be described here.

The substrate 100 is an insulating substrate. A glass substrate or a quartz substrate can be used as the substrate 100, for example. In this embodiment, a glass substrate is used. When the substrate 100 is a mother glass, the substrate may have any size of the first generation (e.g., 320 mm×400 mm) to the tenth generation (e.g., 2950 mm×3400 mm); however, the substrate is not limited thereto.

The first wiring layer 102 may be formed using a conductive material (e.g., a metal, or a semiconductor to which an impurity element imparting one conductivity type is added).

Note that the first wiring layer 102 may have a single-layer structure or a stacked structure including a plurality of layers. A stacked structure of three layers in which an aluminum layer is interposed between titanium layers is employed here, for example. Note that the first wiring layer 102 forms at least a scan line and a gate electrode.

The insulating layer 104 may be formed using an insulating material (e.g., silicon nitride, silicon nitride oxide, silicon oxynitride, or silicon oxide). Note that the insulating layer 104 may have a single-layer structure or a stacked structure including a plurality of layers. A stacked structure of two layers in which a silicon oxynitride layer is stacked over a silicon nitride layer is employed here, for example. Note that the insulating layer 104 serves as at least a gate insulating layer.

Note that "silicon oxynitride" means silicon in which the number of oxygen atoms is larger than that of nitrogen atoms and, in which oxygen, nitrogen, silicon, and hydrogen are preferably contained at concentrations ranging from 50 at. % to 70 at. %, 0.5 at. % to 15 at. %, 25 at. % to 35 at. %, and 0.1 at. % to 10 at. %, respectively, in the case where measurements are performed using Rutherford backscattering spectrometry (RBS) and hydrogen forward scattering spectrometry (HFS).

Note that "silicon nitride oxide" means silicon in which the number of nitrogen atoms is larger than that of oxygen atoms and, in which oxygen, nitrogen, silicon, and hydrogen are preferably contained at concentrations ranging from 5 at. % to 30 at. %, 20 at. % to 55 at. %, 25 at. % to 35 at. %, and 10 at. % to 30 at. %, respectively, in the case where measurements are performed using RBS and HFS. Note that percentages of nitrogen, oxygen, silicon, and hydrogen fall within the ranges given above, where the total number of atoms contained in the silicon oxynitride or the silicon nitride oxide is defined as 100 at. %.

The first semiconductor layer 106 is preferably formed using a semiconductor material having high carrier mobility. As a semiconductor material having high carrier mobility, for example, a crystalline semiconductor can be used. As a crystalline semiconductor, for example, a microcrystalline semiconductor can be used. Here, a microcrystalline semiconductor means a semiconductor having an intermediate structure between amorphous and crystalline structures (including a single crystal structure and a polycrystalline structure). A microcrystalline semiconductor is a semiconductor having a third state that is stable in terms of free energy and a crystalline semiconductor having short-range order and lattice distortion, in which columnar or needle-like crystals having a grain size of greater than or equal to 2 nm and less than or equal to 200 nm, preferably greater than or equal to 10 nm and less than or equal to 80 nm, more preferably greater than or equal to 20 nm and less than or equal to 50 nm have grown in a direction normal to the substrate surface. Accordingly, there is a case where crystal grain boundaries are formed at the interface of column-like crystals or needle-like crystals.

Microcrystalline silicon, which is one of microcrystalline semiconductors, has a peak of Raman spectrum which is shifted to a lower wave number side than 520 cm$^{-1}$ that represents single crystal silicon. That is, the peak of the Raman spectrum of the microcrystalline silicon is between 520 cm$^{-1}$ that represents single crystal silicon and 480 cm$^{-1}$ that represents amorphous silicon. In addition, microcrystalline silicon contains hydrogen or halogen of at least 1 atomic percent or more in order to terminate a dangling bond. Moreover, microcrystalline silicon contains a rare gas element such as He, Ar, Kr, or Ne to further promote lattice distortion, so that stability is increased and a favorable microcrystalline semiconductor can be obtained.

Moreover, when the concentration of oxygen and nitrogen included in the first semiconductor layer 106 (a value measured by secondary ion mass spectrometry) is less than $1\times10^{18}$ cm$^{-3}$, the crystallinity of the first semiconductor layer 106 can be improved.

The second semiconductor layer 108 is preferably formed using a semiconductor material having low carrier mobility in order to serve as a buffer layer, and preferably has an amorphous semiconductor and a minute semiconductor crystal grain and has lower energy at an urbach edge measured by a constant photocurrent method (CPM) or photoluminescence spectroscopy and a smaller amount of absorption spectra of defects, as compared with a conventional amorphous semiconductor. That is, as compared with the conventional amorphous semiconductor, such a semiconductor layer is a well-ordered semiconductor layer which has a few defects and whose tail slope of a level at a band edge (a mobility edge) in the valence band is steep. Note that in this specification, such a semiconductor layer is referred to as "a layer containing an amorphous semiconductor".

The second semiconductor layer 108 is preferably "a layer containing an amorphous semiconductor", "a layer containing an amorphous semiconductor" containing halogen, or "a layer containing an amorphous semiconductor" containing nitrogen, and most preferably "a layer containing an amorphous semiconductor" and containing an NH group or an NH$_2$ group. Note that the present invention is not limited thereto.

An interface region between the first semiconductor layer 106 and the second semiconductor layer 108 includes microcrystalline semiconductor regions and an amorphous semiconductor between the microcrystalline semiconductor regions. Specifically, the interface region between the first semiconductor layer 106 and the second semiconductor layer 108 includes a microcrystalline semiconductor region which extends in a conical or pyramidal shape from the first semiconductor layer 106 and "a layer containing an amorphous semiconductor" which is similar to the second semiconductor layer 108.

When the second semiconductor layer 108 is, for example, "a layer containing an amorphous semiconductor", "a layer containing an amorphous semiconductor" containing halogen, "a layer containing an amorphous semiconductor" containing nitrogen, or "a layer containing an amorphous semiconductor" containing an NH group or an NH$_2$ group, the off-state current of the TFT can be reduced. Since a conical or pyramidal microcrystalline semiconductor region is included in the above-described interface region, the resistance in a vertical direction (a thickness direction), in other words, the resistance in the entire region of the first semiconductor layer 106 and the second semiconductor layer 108 can be lowered, so that the on-state current of the TFT can be increased.

Note that when the first semiconductor layer 106 is thinner, the on-state current is decreased. When the first semiconductor layer 106 is thicker, the off-state current is increased because a contact area between the first semiconductor layer 106 and the second wiring layer 112 is increased.

Most of the above microcrystalline semiconductor region preferably includes a crystal grain having a conical or pyramidal shape whose top gets narrower from the insulating layer 104 toward the second semiconductor layer 108. Alternatively, the most of the above microcrystalline semiconductor region may include a crystal grain having a conical or pyramidal shape whose top gets wider from the insulating layer 104 toward the second semiconductor layer 108.

When the microcrystalline semiconductor region includes a crystal grain having a conical or pyramidal shape whose top gets narrower from the insulating layer 104 toward the second semiconductor layer 108 in the above interface region, the proportion of the microcrystalline semiconductor region at the first semiconductor layer 106 side is higher than that at the second semiconductor layer 108 side. The microcrystalline semiconductor region grows from a surface of the first semiconductor layer 106 in the thickness direction. When the flow ratio of hydrogen to silane in a source gas is reduced (that is, the dilution ratio is reduced) or the concentration of the source gas containing nitrogen is increased, crystal growth of the microcrystalline semiconductor region is suppressed, and thus, a crystal grain comes to have a conical or pyramidal shape, and a large part of a semiconductor which is formed by deposition becomes amorphous.

Further, the interface region described above preferably includes nitrogen, in particular, an NH group or an $NH_2$ group. This is because defects are reduced and carriers flow easily when nitrogen, in particular, an NH group or an. $NH_2$ group is bonded with dangling bonds of silicon atoms at an interface between crystals included in the microcrystalline semiconductor region or at an interface between the microcrystalline semiconductor region and the amorphous semiconductor region. Therefore, by making the concentration of nitrogen $1\times10^{20}$ $cm^{-3}$ to $1\times10^{21}$ $cm^{-3}$, dangling bonds of silicon atoms can be reduced and carriers flow easily. As a result, a bonding which promotes the carrier transfer is formed in a crystal grain boundary or a defect, whereby the carrier mobility of the interface region is increased. Therefore, the field-effect mobility of the TFT is increased.

Furthermore, by reducing the concentration of oxygen in the interface region, defects and bonding inhibiting carrier transfer at the interface between the microcrystalline semiconductor region and the amorphous semiconductor region or the interface between the crystal grains can be reduced.

When the distance from the interface of the insulating layer 104 to the edge of the step portion of the second semiconductor layer 108 is greater than or equal to 30 nm and less than or equal to 110 nm, preferably greater than or equal to 35 nm and less than or equal to 60 nm, the off-state current of the TFT can be efficiently suppressed.

The impurity semiconductor layer 110 is formed using a semiconductor to which an impurity element imparting one conductivity type is added. In the case where the TFT is an n-channel TFT, for example, it is possible to use silicon to which P or As is added as the impurity element imparting one conductivity type. In the case where the TFT is a p-channel TFT, for example, it is possible to add B as the impurity element imparting one conductivity type; however, it is preferable to use an n-channel TFT. Thus, silicon to which P is added is used here, for example. Note that the impurity semiconductor layer 110 may be formed using an amorphous semiconductor or a crystalline semiconductor such as a microcrystalline semiconductor.

When the impurity semiconductor layer 110 is formed using an amorphous semiconductor, the flow rate of a dilution gas is greater than or equal to 1 time and less than or equal to 10 times, preferably greater than or equal to 1 time and less than or equal to 5 times, as high as that of a deposition gas. When the impurity semiconductor layer 110 is formed using a crystalline semiconductor, the flow rate of the dilution gas is greater than or equal to 10 times and less than or equal to 2000 times, preferably greater than or equal to 50 times and less than or equal to 200 times, as high as that of the deposition gas.

The second wiring layer 112 may be formed using a conductive material (e.g., a metal or a semiconductor to which an impurity element imparting one conductivity type is added) in a manner similar to that of the first wiring layer 102. In addition, the second wiring layer 112 may have a single layer structure or a stacked structure including a plurality of layers. A stacked structure of three layers in which an Al layer is interposed between Ti layers is employed here, for example. Note that the second wiring layer 112 forms at least a signal line, and source and drain electrodes.

At least a portion of the second wiring layer 112 that is in contact with the first semiconductor layer 106 is preferably formed using a material having a low work function, such as Ti, Y, or Zr. Alternatively, titanium nitride may be used. By forming the portion of the second wiring layer 112 that is in contact with the first semiconductor layer 106 with the use of Ti, Y, or Zr, the off-state current can be decreased. By forming a portion of the second wiring layer 112 that is in contact with the impurity semiconductor layer 110 with the use of Ti, Y, or Zr, the on-state current can be increased. Therefore, a TFT with a high on/off ratio, in other words, a TFT having a favorable switching characteristic can be obtained.

The semiconductor layer having high carrier mobility is provided as the first semiconductor layer 106 and the semiconductor layer having low carrier mobility is provided as the second semiconductor layer 108; thus, the on-state current of the TFT illustrated in FIG. 1 can be increased and the off-state current thereof can be decreased.

Since the entire region of the first semiconductor layer 106 overlaps with the first wiring layer 102 in the TFT illustrated in FIG. 1, adverse effects of a photocurrent can be suppressed. With such a structure, for example, even in the case where the TFT illustrated in FIG. 1 is provided over an array substrate in a liquid crystal display device and light is emitted from the substrate 100 side, the switching characteristic can be maintained. Note that the TFT of this embodiment is not limited to this TFT, and the entire region of the first semiconductor layer 106 does not necessarily overlap with the first wiring layer 102, for example, in the case where the substrate 100 does not transmit light.

Note that the second semiconductor layer provided in the TFT of this embodiment may be formed without a space over the first semiconductor layer. Such a mode is shown in FIG. 3.

Figure 3:
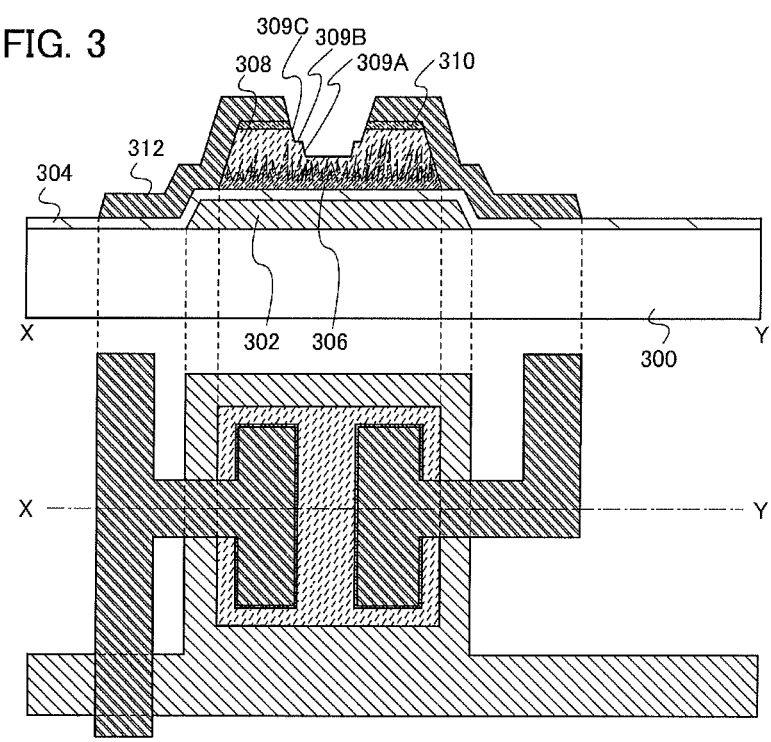
FIG. 3 is a cross-sectional view and a top view illustrating a TFT of Embodiment 1.

That is, a TFT illustrated in FIG. 3 is provided over a substrate 300 and includes a first wiring layer 302; an insulating layer 304 that covers the first wiring layer 302; a first semiconductor layer 306 an entire surface of which overlaps with the first wiring layer 302; a second semiconductor layer 308 that is on and in contact with the first semiconductor layer 306 and has lower carrier mobility than the first semiconductor layer 306; impurity semiconductor layers 310 that are in contact with the second semiconductor layer 308; and second wiring layers 312 that are in contact with at least the impurity semiconductor layers 310. A back-channel portion in the second semiconductor layer 308 includes a step portion.

Note that the shape of the back-channel portion in the second semiconductor layer 308 is not limited to the shape illustrated, but may be a shape having a plurality of curved surfaces like the second semiconductor layer 208 illustrated in FIG. 2.

Note that in the TFT of this embodiment, the microcrystalline semiconductor region that includes a crystal grain having a conical or pyramidal shape whose top gets narrower is not necessarily provided in the interface region between the first semiconductor layer and the second semiconductor layer. In addition, the second semiconductor layer may be formed using an amorphous semiconductor. Such a mode is shown in FIG. 4.

Figure 4:
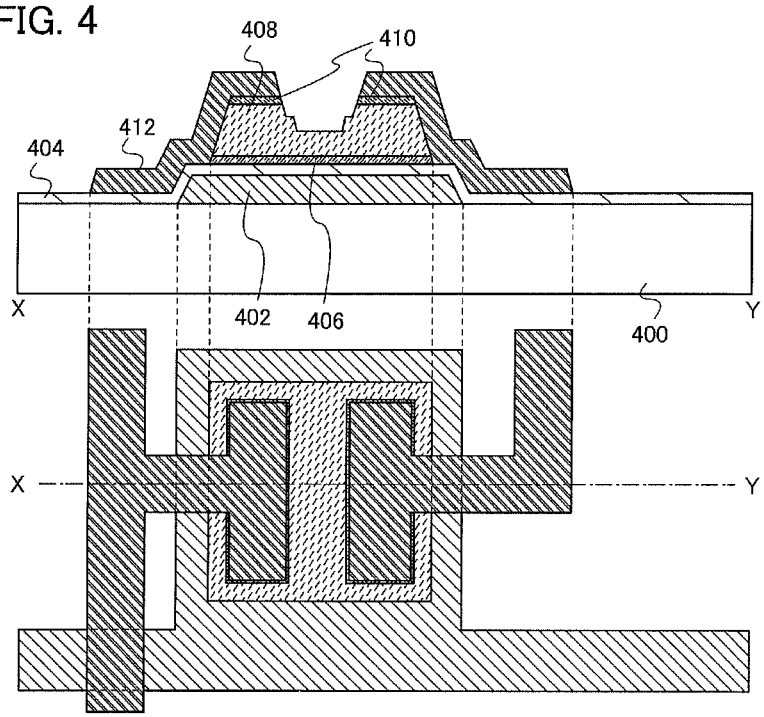
FIG. 4 is a cross-sectional view and a top view illustrating a TFT of Embodiment 1.

That is, a TFT illustrated in FIG. 4 is provided over a substrate 400 and includes a first wiring layer 402; an insulating layer 404 that covers the first wiring layer 402; a first semiconductor layer 406 an entire surface of which overlaps with the first wiring layer 402; a second semiconductor layer 408 that is on and in contact with the first semiconductor layer 406 and has lower carrier mobility than the first semiconductor layer 406; impurity semiconductor layers 410 that are in contact with the second semiconductor layer 408; and second wiring layers 412 that are in contact with at least the impurity semiconductor layers 410. A back-channel portion in the second semiconductor layer 408 includes a step portion. The microcrystalline semiconductor region that includes a crystal grain having a conical or pyramidal shape whose top gets narrower is not provided in the interface region between the first semiconductor layer 406 and the second semiconductor layer 408, and the second semiconductor layer 408 is an amorphous semiconductor layer.

Note that, also in FIG. 4, the shape of the back-channel portion in the second semiconductor layer 408 is not limited to the shape illustrated as in the case of FIG. 3, but may be a shape having a plurality of curved surfaces like the second semiconductor layer 208 illustrated in FIG. 2.

Note that the TFT of this embodiment is not limited to the above-described TFT, and the first semiconductor layer may be omitted. Such a mode is shown in FIG. 5.

Figure 5:
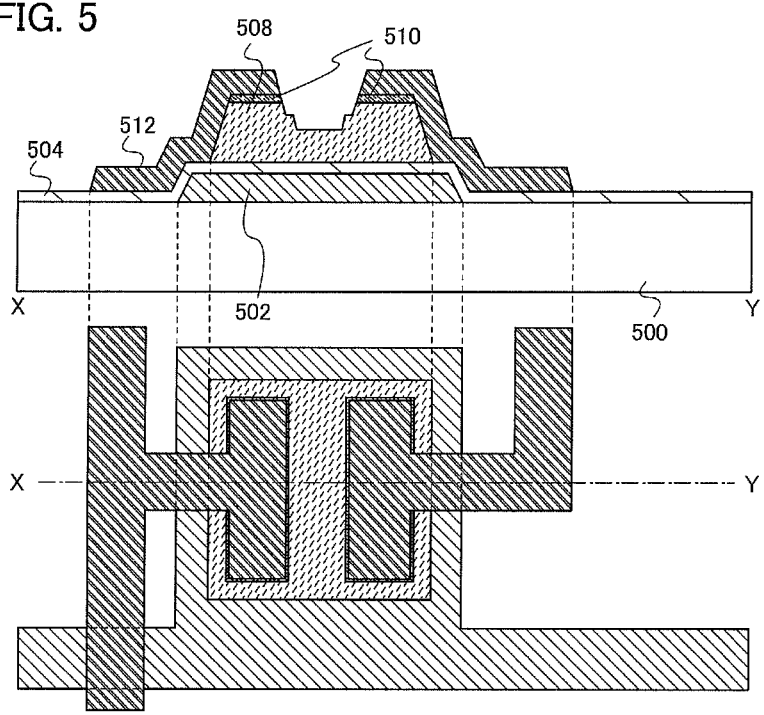
FIG. 5 is a cross-sectional view and a top view illustrating a TFT of Embodiment 1.

That is, a TFT illustrated in FIG. 5 is formed over a substrate 500 and includes a first wiring layer 502; an insulating layer 504 that covers the first wiring layer 502; a semiconductor layer 508 over the insulating layer 504; impurity semiconductor layers 510 in contact with the semiconductor layer 508; and second wiring layers 512 in contact with at least the impurity semiconductor layers 510. A back-channel portion in the semiconductor layer 508 includes a step portion. An amorphous semiconductor layer may be provided as the semiconductor layer 508.

Note that, also in FIG. 5, the shape of the back-channel portion in the semiconductor layer 508 is not limited to the shape illustrated as in the case of FIG. 3 and FIG. 4, but may be a shape having a plurality of curved surfaces like the second semiconductor layer 208 illustrated in FIG. 2.

As shown above, each of the TFTs of this embodiment includes the step portion in the back-channel portion. Next, the electric-field intensity of a structural example of the TFT of this embodiment is calculated, and advantages of the TFT of this embodiment over a conventional TFT are discussed.

Note that ATLAS (manufactured by Silvaco Data Systems., Inc.) was used for the calculation in this embodiment.

Note that a surface of the first semiconductor layer 106 was assumed to be flat for convenience. Note also that the insulating layer 104, the first semiconductor layer 106, the second semiconductor layer 108, the impurity semiconductor layer 110, and the second wiring layer 112 were respectively assumed to be a silicon oxynitride layer, a microcrystalline silicon layer, a "silicon layer including amorphous silicon", a "silicon layer including amorphous silicon" doped with phosphorus, and a metal layer.

Note that the band gap, the electron affinity, the dielectric constant, the electron mobility, and the hole mobility of microcrystalline silicon were respectively assumed to be 1.1 eV, 3.6 eV, 11.8, 3.0 cm$^2$/Vs, and 0.1 cm$^2$/Vs.

Note also that the band gap, the electron affinity, the dielectric constant, the electron mobility, and the hole mobility of silicon including amorphous silicon were respectively assumed to be 1.7 eV, 3.4 eV, 11.8, 1.0 cm$^2$/Vs, and 0.1 cm$^2$/Vs.

The relative constant of silicon oxynitride was assumed to be 4.1.

The microcrystalline silicon layer and the "silicon layer including amorphous silicon" doped with phosphorus, and the "silicon layer including amorphous silicon" doped with phosphorus and the metal layer were assumed to have ohmic contacts with each other.

The channel length (the distance between a source electrode and a drain electrode) of the TFT was assumed to be 10 μm.

Figure 6:
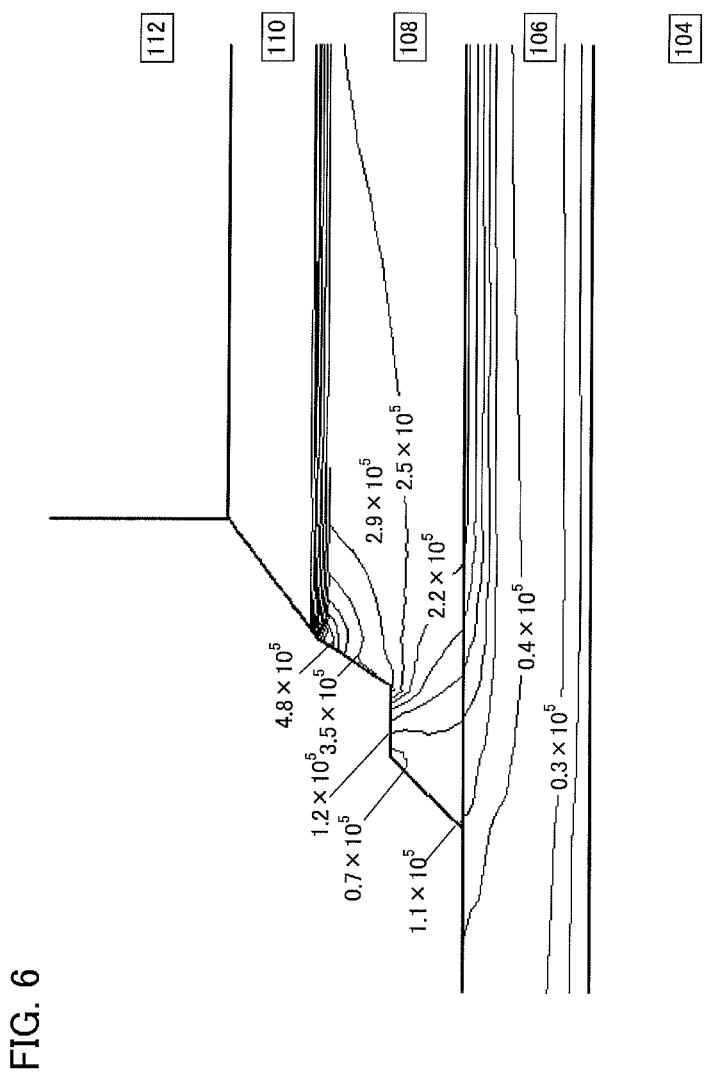
FIG. 6 shows calculation results.

FIG. 6 shows the electric-field intensity of the TFT in FIG. 1 (i.e., a structural example of this embodiment) when the gate voltage $V_{gs}$ is 20 V and the drain voltage $V_{ds}$ is 10 V.

Figure 7:
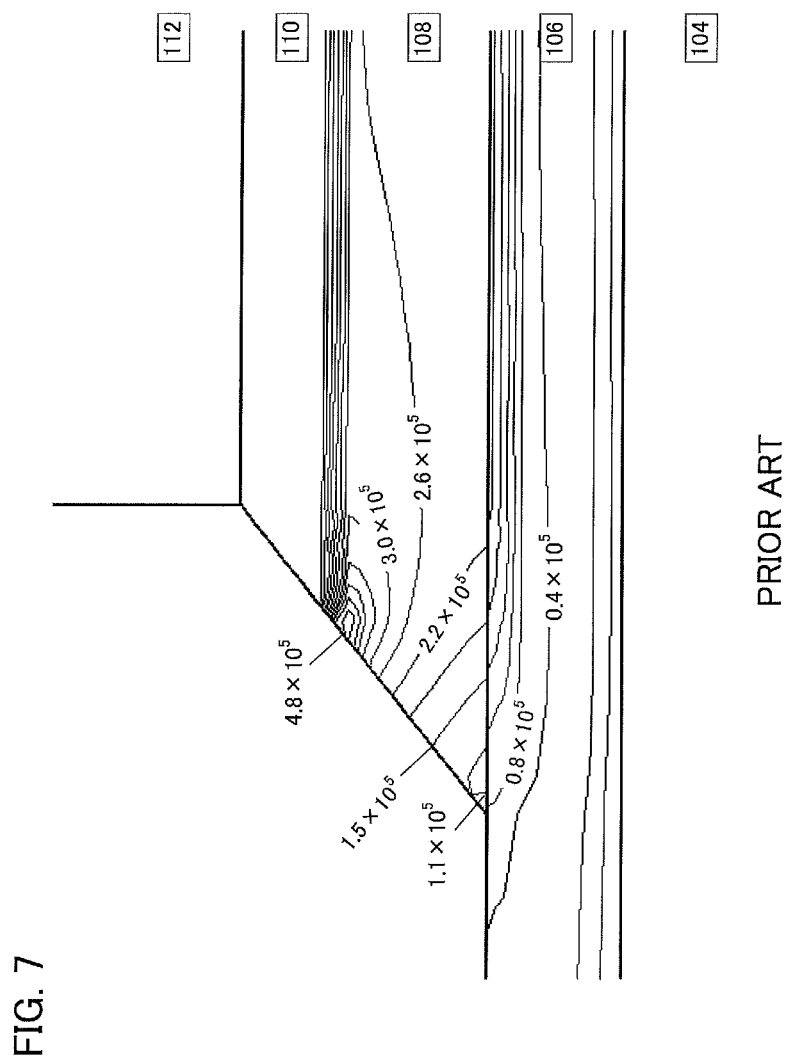
FIG. 7 shows calculation results.

FIG. 7 shows the electric-field intensity of the TFT in FIG. 1 having another structure in which the step portion is not provided (i.e., a conventional structure) when the gate voltage $V_{gs}$ is 20 V and the drain voltage $V_{ds}$ is 10 V.

Figure 8:
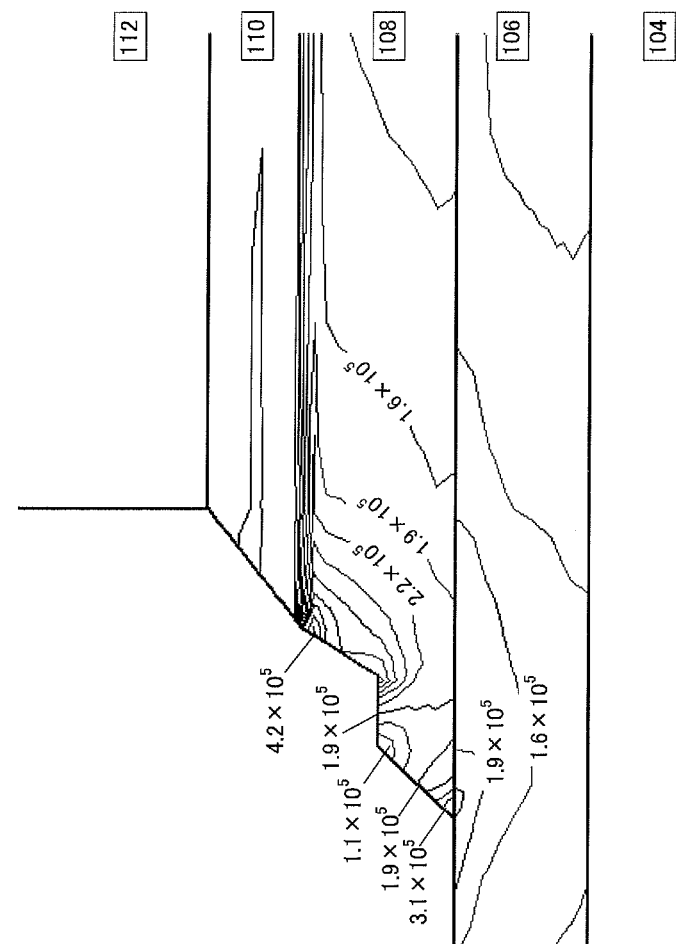
FIG. 8 shows calculation results.

FIG. 8 shows the electric-field intensity of the TFT in FIG. 1 (i.e., a structural example of this embodiment) when the gate voltage $V_{gs}$ is 5 V and the drain voltage $V_{ds}$ is 10 V.

Figure 9:
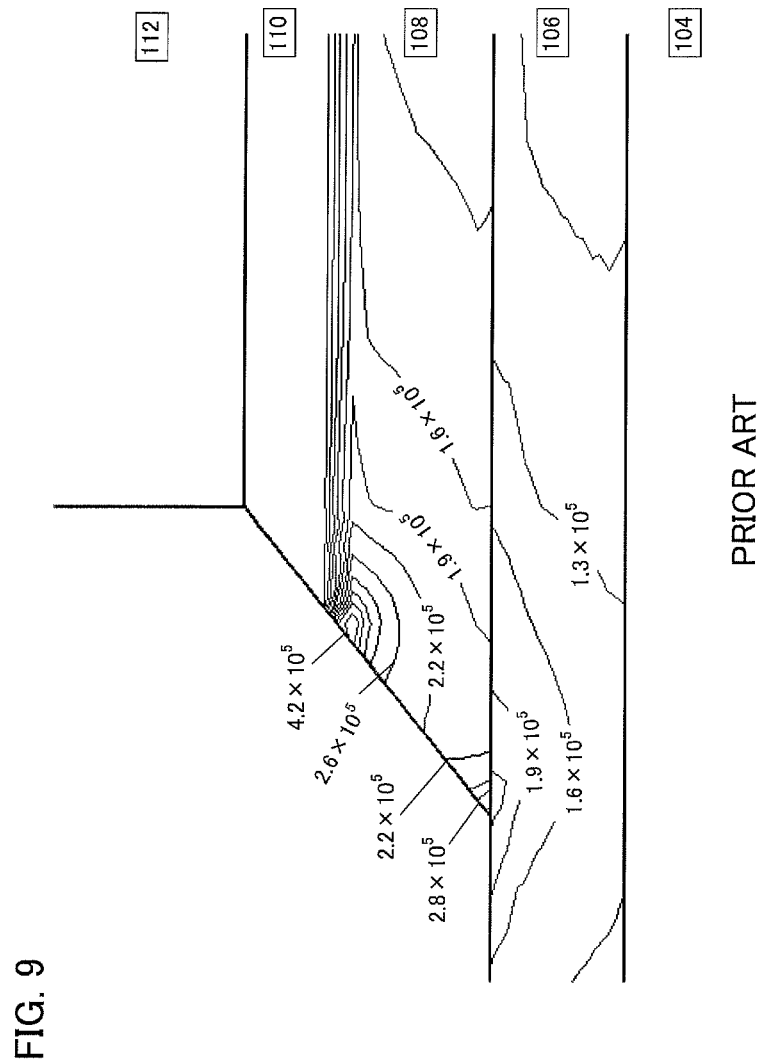
FIG. 9 shows calculation results.

FIG. 9 shows the electric-field intensity of the TFT in FIG. 1 having another structure in which the step portion is not provided (i.e., a conventional structure) when the gate voltage $V_{gs}$ is 5 V and the drain voltage $V_{ds}$ is 10 V.

Note that in this specification, a "gate voltage" means a potential difference of a gate potential with respect to a source potential.

In FIG. 6, FIG. 7, FIG. 8, and FIG. 9, a portion of equal electric-field intensity is shown by a line, and equal electric-field intensity lines are illustrated. The number on each equal electric-field intensity line is a potential (V/cm) of the equal electric-field intensity line.

As seen in FIG. 6 and FIG. 8, a portion with a weak electric field is formed in a step portion of a back-channel portion, and the electric-field intensity in the vicinity of the step portion is alleviated. As seen in FIG. 7 and FIG. 9, in the case where the step portion is not provided, the electric-field intensity is not alleviated. By alleviating the electric-field intensity in such a manner, the rate of electrons accelerated by an electric field (hot carriers) is reduced, and the number of electrons trapped in the back-channel portion in the second semiconductor layer 108 can be reduced. Therefore, the TFT of this embodiment can have a high on-state current.

Although the edges of the step portions in the drawings of this embodiment are sharp, this embodiment is not limited to this, and the edge of the step portion may be blunt. By making a blunt edge of the step portion, the concentration of the electric field in the step portion can further be alleviated, and an insulating film (a so-called passivation film) can cover the TFT more favorably.

As described above, in the TFT of this embodiment, the concentration of the electric field in the path of current is alleviated and the on-state current is increased. Such a TFT can have a high on/off ratio, thereby having an excellent switching characteristic.

Note that a leak path becomes longer in the TFT of this embodiment since the step portion is provided in the back-channel portion; as a result, the off-state current can be reduced.

(Embodiment 2)

In this embodiment, an example of a method for manufacturing a TFT which is one embodiment of the present invention will be described. Specifically, a method for manufacturing the TFT illustrated in FIG. 1 will be described. Note that the same reference numerals are basically used for the same portions as FIG. 1.

Figure 10A:
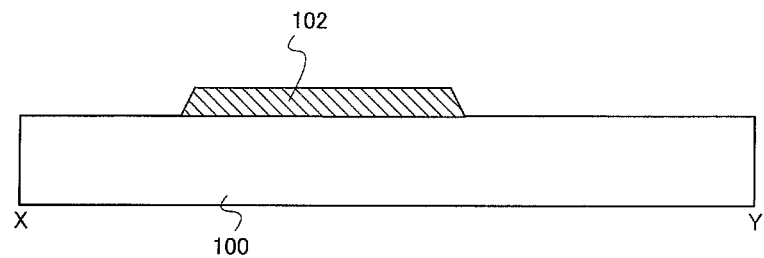
FIGS. 10A to 10C illustrate a method for manufacturing the TFT in FIG. 1.

First, the first wiring layer 102 is formed over the substrate 100 (FIG. 10A). The first wiring layer 102 may be formed as follows: a film of a conductive material is formed over the entire surface of the substrate 100 by a CVD method or a sputtering method, and processing is performed by a photolithography method.

Figure 10B:
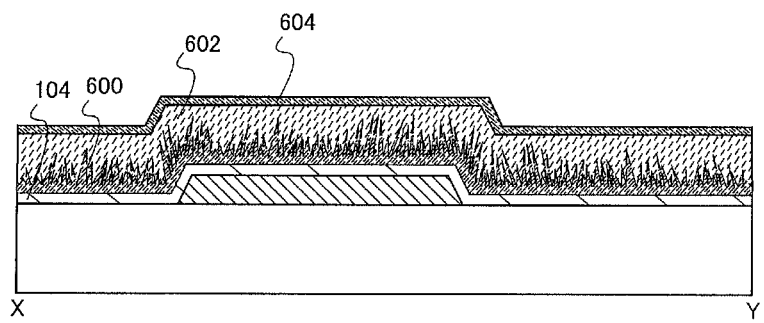

Next, the insulating layer 104 is formed to cover the first wiring layer 102, and a first semiconductor film 600, a second semiconductor film 602, and an impurity semiconductor film 604 are formed over the insulating layer 104 (FIG. 10B).

The first semiconductor film 600 is formed using glow discharge plasma in a reaction chamber of the plasma CVD apparatus with the use of a mixture of hydrogen and a deposition gas containing silicon (e.g., $SiH_4$). Alternatively, the first semiconductor film 600 is formed using glow discharge plasma with the use of a mixture of a deposition gas containing silicon, hydrogen, and a rare gas such as He, Ar, Ne, or Kr. The flow rate of hydrogen is 10 to 2000 times, preferably 10 to 200 times, as large as that of the deposition gas containing silicon.

Further alternatively, the first semiconductor film 600 may be formed using germanium with the use of a deposition gas such as $GeH_4$ or $Ge_2H_6$.

Before the first semiconductor film 600 is formed, impurity elements in the reaction chamber of the plasma CVD apparatus are removed by introducing a deposition gas containing silicon or germanium with the air in the reaction chamber exhausted, so that impurity elements at the interface of the films which are formed can be reduced. Accordingly, electric characteristics of the TFT can be improved.

The second semiconductor film 602 is formed using glow discharge plasma in a reaction chamber of the plasma CVD apparatus with the use of a mixture of hydrogen and a deposition gas containing silicon. At this time, the flow rate of hydrogen with respect to a deposition gas containing silicon is reduced (that is, a dilution ratio is reduced) from the deposition condition of the first semiconductor film 600. Accordingly, the crystal growth is suppressed, and as the film is deposited, the second semiconductor film 602 which does not contain a microcrystalline semiconductor region can be formed.

At the initial stage of deposition of the second semiconductor film 602, the flow rate of hydrogen with respect to the deposition gas containing silicon is reduced (that is, the dilution ratio is reduced) from the deposition condition of the first semiconductor film 600. Accordingly, a microcrystalline semiconductor region can remain in the second semiconductor film 602. In addition, the flow rate of hydrogen with respect to the deposition gas containing silicon is further reduced (that is, the dilution ratio is further reduced) from the above condition, so that the second semiconductor film 602 can be a semiconductor film which is "a layer containing an amorphous semiconductor." Furthermore, the flow rate of hydrogen with respect to the deposition gas containing silicon is further reduced (that is, the dilution ratio is further reduced) from the above condition and a gas containing nitrogen is mixed, so that an amorphous semiconductor region in the second semiconductor film 602 can be enlarged. The second semiconductor film 602 may also be formed using germanium.

At the initial stage of the deposition of the second semiconductor film 602, the first semiconductor film 600 is used as a seed crystal and the film is deposited on the entire surface. After that, the crystal growth is partially suppressed, and a conical or pyramidal microcrystalline semiconductor region grows (in the middle stage of the deposition). Further, the crystal growth of the conical or pyramidal microcrystalline semiconductor region is suppressed, and the second semiconductor film 602 which does not contain a microcrystalline semiconductor region is formed in an upper layer (in the later stage of the deposition).

It is preferable that nitrogen be contained at $1\times10^{20}$ cm$^{-3}$ to $1\times10^{21}$ cm$^{-3}$ in the second semiconductor film 602. At this time, nitrogen is preferably in a state of an NH group or an $NH_2$ group. This is because dangling bonds of semiconductor atoms are reduced and carriers flow without difficulty.

Note that in formation of the second semiconductor film 602, the flow rate of the dilution gas is greater than or equal to 10 times and less than or equal to 2000 times, preferably greater than or equal to 50 times and less than or equal to 200 times, as large as that of the deposition gas, and the flow rate ratio of the dilution gas is preferably set smaller than that in the case of forming the first semiconductor layer 106.

The oxygen concentration in the second semiconductor film 602 is preferably low. By reducing the oxygen concentration in the second semiconductor film 602, bonding at the interface between the microcrystalline semiconductor region and the amorphous semiconductor region or at the interface between the microcrystalline semiconductor regions which interrupts the carrier transfer can be reduced.

The impurity semiconductor film 604 may be formed with the use of a formation gas for the first semiconductor film 600 or the second semiconductor film 602 to which an impurity element imparting one conductivity type is added. For example, a gas containing $PH_3$ may be added to the formation gas.

Figure 10C:
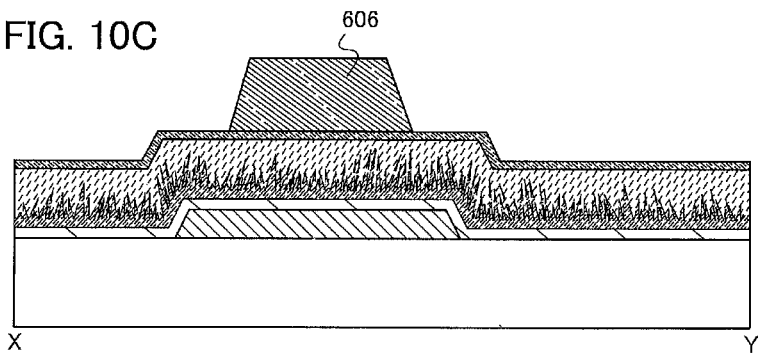

Next, a resist mask 606 is formed over the impurity semiconductor film 604 (FIG. 10C). Note that before the formation of the resist mask 606, cleaning with ozone water is preferably performed so that adhesion between the impurity semiconductor film 604 and the resist mask 606 can be increased. By cleaning with ozone water, a surface of the impurity semiconductor film 604 is oxidized. Note that without limitation to the ozone water cleaning, another method using oxygen plasma or the like may also be employed for oxidation.

Figure 11A:
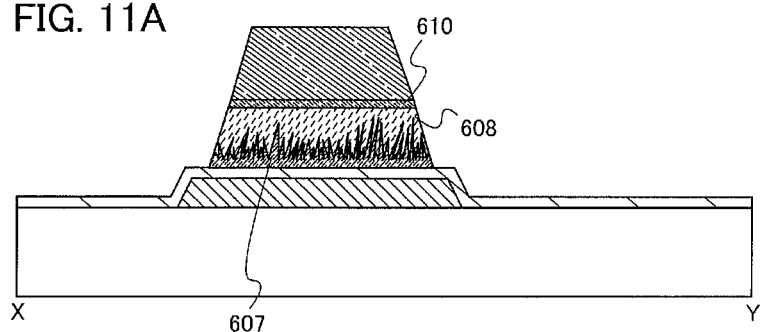
FIGS. 11A to 11C illustrate the method for manufacturing the TFT in FIG. 1.

Next, with the use of the resist mask 606, the first semiconductor film 600, the second semiconductor film 602, and the impurity semiconductor film 604 are processed, so that a first semiconductor layer 607, a second semiconductor layer 608, and an impurity semiconductor layer 610 are formed (FIG. 11A). After that, the resist mask 606 is removed.

Figure 11B:
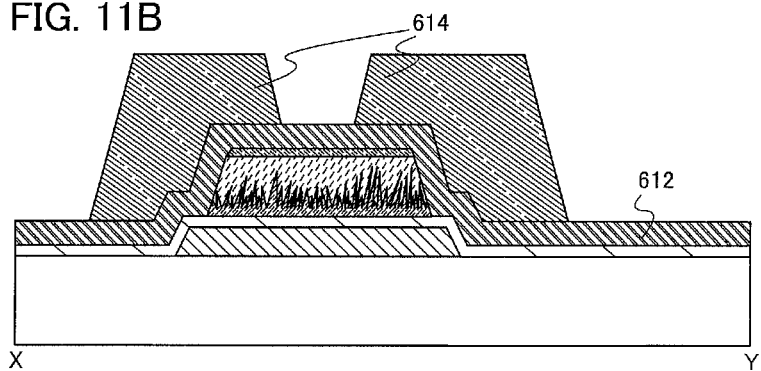

Next, a conductive film 612 is formed to cover the first semiconductor layer 607, the second semiconductor layer 608, and the impurity semiconductor layer 610, and then a resist mask 614 is formed over the conductive film 612 (FIG. 11B).

Figure 11C:
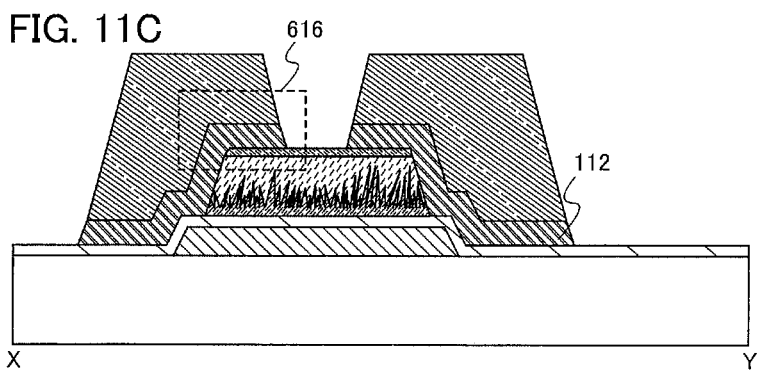

Next, with the use of the resist mask 614, the conductive film 612 is processed, so that the second wiring layer 112 is formed (FIG. 11C).

Next, the impurity semiconductor layer 610 and the second semiconductor layer 608 are processed. This processing step is illustrated in FIGS. 12A to 12E. The processing here is performed by one etching step. Note that in FIGS. 12A to 12E, only enlarged views of a portion 616 in FIG. 11C are illustrated.

Figure 12A:
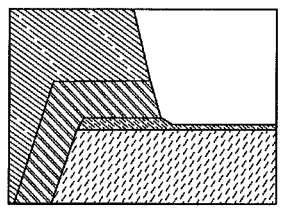
FIGS. 12A to 12E illustrate methods for manufacturing the TFT in FIG. 1.

First, the impurity semiconductor layer is processed by etching, whereby the resist mask and the second wiring layer are recessed, and the impurity semiconductor layer that overlaps with the recessed portion is etched to have an inclination (FIG. 12A).

Figure 12D:
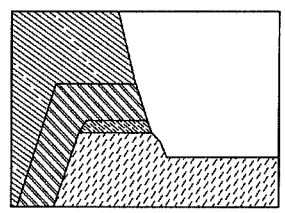
Figure 12B:
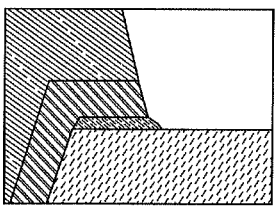

As the etching proceeds further, the impurity semiconductor layer is further etched, so that the second semiconductor layer is exposed (FIG. 12B). At this time, a step portion is formed in a side surface of the impurity semiconductor layer. This is because the etching rate of the impurity semiconductor layer is changed in the etching. Since the quality of the surface of the impurity semiconductor layer is changed by oxidation or the like, the etching rate is low at the initial stage of the etching of the impurity semiconductor layer. However, after the oxidized portion in the vicinity of the surface is etched, the etching rate is increased. As a result, the taper angle of the oxidized portion in the vicinity of the surface is small, and the taper angle in a portion close to the second semiconductor layer is large. Thus, the step portion is formed in the side surface of the impurity semiconductor layer.

Figure 12E:
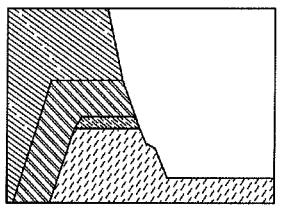
Figure 12C:
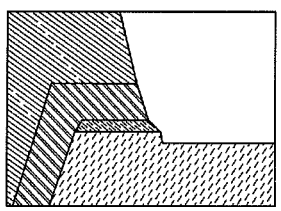

After that, as the etching is proceeds further, the second semiconductor layer is also etched (FIG. 12C). Since the etching rate of the second semiconductor layer is high like that of a lower portion of the impurity semiconductor layer, the second semiconductor layer is etched so that the taper angle of the side surface thereof is large. When the etching proceeds in this manner, the step portion can be lowered to the vicinity of the interface between the impurity semiconductor layer and the second semiconductor layer with the shape of the step kept. In FIG. 12C, the step portion is located at the interface between the impurity semiconductor layer and the second semiconductor layer.

After that, as the etching proceeds further, the step portion can be lowered to the side surface of the second semiconductor layer with the shape of the step kept (FIG. 12D). Then, when the etching proceeds still further, the step portion can be lowered to an appropriate position with the shape of the step kept (FIG. 12E).

In such a manner, the step portion can be formed in a given portion of the second semiconductor layer.

Note that the etching may be performed under such conditions that the etching rate of silicon or P-doped silicon is high, and the etching rate of silicon oxide is low. However, when the etching rate of silicon oxide is too low, the etching on an oxidized portion of a surface proceeds at an extremely slow pace. Therefore, as the etching condition in this embodiment, the etching rate of silicon is preferably three times to five times as high as the etching rate of silicon oxide.

Note that the above-described etching may be performed using inductively coupled plasma (ICP) with the use of a mixed gas of $BCl_3$ and $Cl_2$ in a state where a bias is applied. The mixed gas of $BCl_3$ and $Cl_2$ is preferable, for example, in the case where the conductive film 612 has a structure in which an Al layer is interposed between Ti layers because the conductive film 612 can also be etched in the same etching step. Thus, a gas containing B is preferable because the etching proceeds while an oxidized portion is reduced.

In addition, $F_2$, $CF_4$, $SF_6$, or the like may be used instead of the above-described etching gas. Alternatively, $BCl_3$ or HBr can be used.

Although the case where one etching step is performed is described here, the etching condition such as the kind of a dry etching gas may be changed in the etching.

Figure 13A:
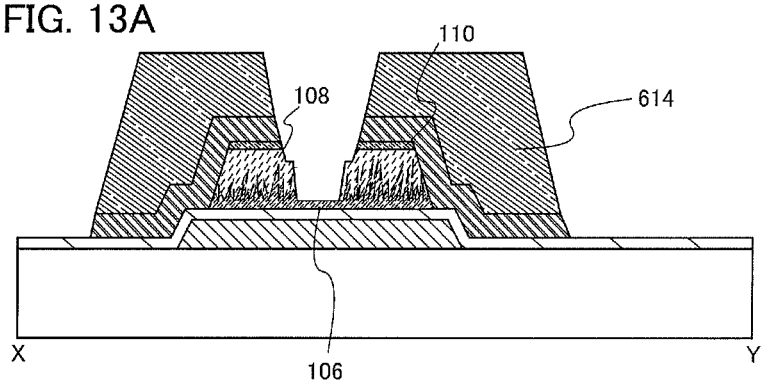
FIGS. 13A and 13B illustrate the method for manufacturing the TFT in FIG. 1.

Note that the etching here is performed until the first semiconductor layer 106 is exposed and a surface of the first semiconductor layer 106 becomes generally flat (FIG. 13A).

Figure 13B:
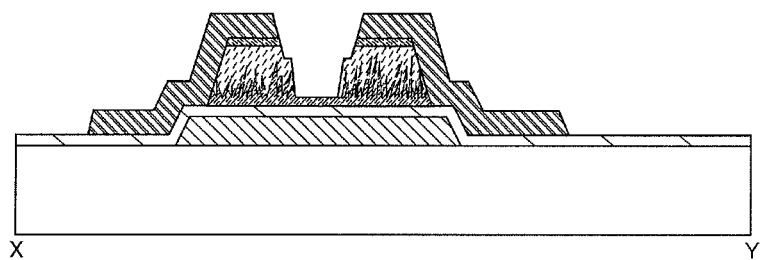

After that, the resist mask 614 is removed, and the TFT illustrated in FIG. 1 can be obtained (FIG. 13B).

In the above-described manner, the TFT illustrated in FIG. 1 can be manufactured.

Note that the TFTs illustrated in FIG. 2, FIG. 3, FIG. 4, and FIG. 5 can be manufactured in a similar manner. In the case where the side surface of the second semiconductor layer has a curved surface, the etching condition may be changed.

(Embodiment 3)

The TFT described in Embodiment 1 can be applied to an array substrate of a display device. In this embodiment, an array substrate in which the TFT illustrated in FIG. 1 is used and a manufacturing method thereof will be described as an example. Further, a display device and a manufacturing method thereof will be described.

Figure 14A:
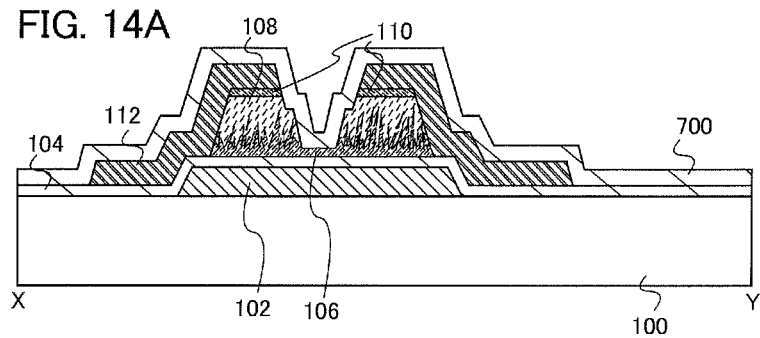
FIGS. 14A to 14C are views for describing Embodiment 3.

First, an insulating film 700 is formed to cover the TFT in FIG. 1 (FIG. 14A).

The insulating film 700 may be formed using an insulating material (e.g., silicon nitride, silicon nitride oxide, silicon oxynitride, or silicon oxide). Note that the insulating film 700 may have a single-layer structure or a stacked structure including a plurality of layers. In this embodiment, silicon nitride is used for example.

Figure 14B:
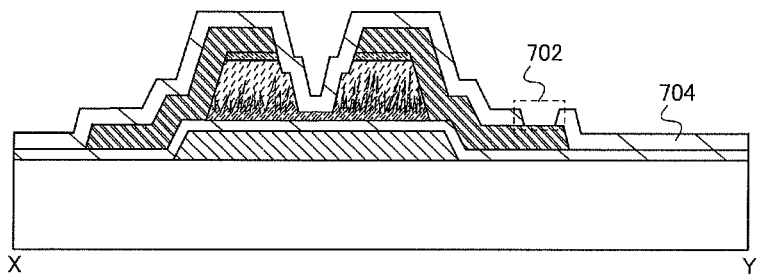

Next, an opening 702 is formed in the insulating film 700 so as to reach the second wiring layer 112, whereby an insulating layer 704 is formed (FIG. 14B). The opening 702 may be formed by a photolithography method.

Note that in the case where the opening 702 is already formed, for example, by forming the insulating film 700 by an inkjet method, the step for further forming the opening 702 is unnecessary.

Figure 14C:
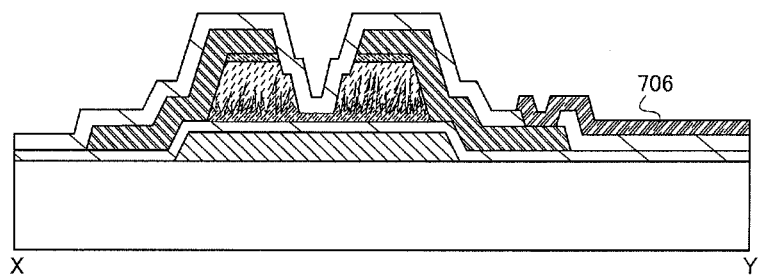

Next, a pixel electrode layer 706 is formed so as to be connected to the second wiring layer 112 through the opening 702 (FIG. 14C).

The pixel electrode layer 706 can be formed using a conductive composition including a conductive high molecule (also referred to as a conductive polymer) having a light-transmitting property. The pixel electrode layer 706 formed using such a conductive composition preferably has a sheet resistance of 10000 Ω/square or less and a light transmittance of 70% or higher at a wavelength of 550 nm. Further, the resistivity of the conductive high molecule included in the conductive composition is preferably 0.1 Ω·cm or less.

As the conductive high molecule, a so-called π electron conjugated conductive high molecule can be used. For example, polyaniline or a derivative thereof, polypyrrole or a derivative thereof, polythiophene or a derivative thereof, and a copolymer of two or more kinds of these materials are given.

The pixel electrode layer 706 can be formed using, for example, indium oxide containing tungsten oxide, indium zinc oxide containing tungsten oxide, indium oxide containing titanium oxide, indium tin oxide containing titanium oxide, indium tin oxide (hereinafter, referred to as ITO), indium zinc oxide, indium tin oxide to which silicon oxide is added, or the like.

The pixel electrode layer 706 may be formed by processing a film formed using the above-described material by a photolithography method.

Although not illustrated, an insulating layer formed using an organic resin by a spin coating method or the like may be provided between the insulating layer 704 and the pixel electrode layer 706.

A display device can be manufactured using the active-matrix substrate in which layers up to and including the pixel electrode layer 706 are formed in a manner described above.

By the way, an additional gate electrode may be formed using the pixel electrode layer in a portion which overlaps with a channel formation region. By forming the additional gate electrode which overlaps with the channel formation region, the field-effect mobility and the on-state current of the TFT can be increased. By forming the additional gate electrode in the TFT illustrated in FIG. 1, the field-effect mobility and the on-state current of the TFT can be drastically increased.

Figure 15:
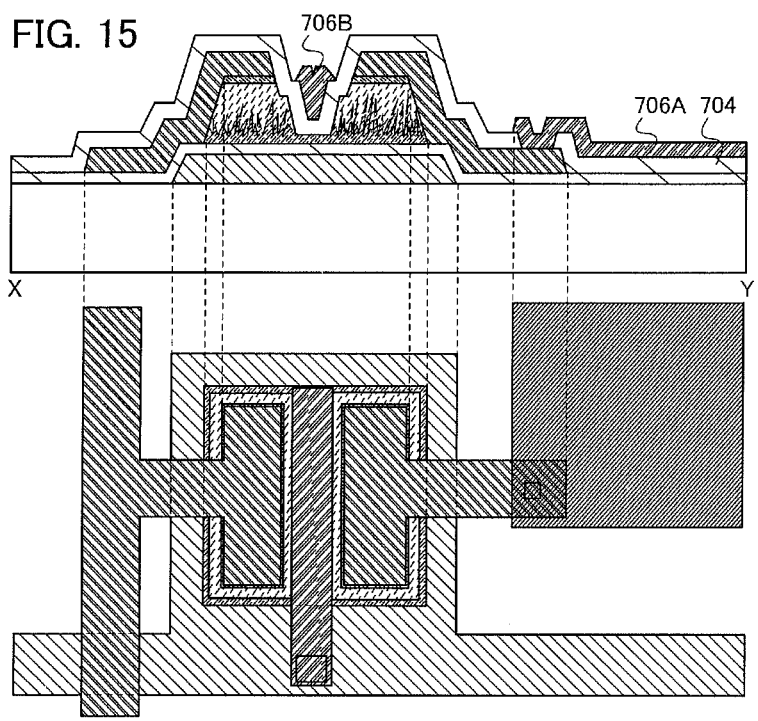
FIG. 15 is a view for describing Embodiment 3.

FIG. 15 illustrates a mode in which the additional gate electrode is formed in the TFT illustrated in FIG. 1. In the TFT illustrated in FIG. 15, an additional gate electrode 706B is formed using the same layer as a pixel electrode layer 706A.

In FIG. 15, the insulating layer 704 functions as a gate insulating layer of the additional gate electrode 706B. The insulating layer 704 is preferably formed using the same material and to approximately the same thickness as the insulating layer 104.

Note that the potential of the gate electrode formed using the first wiring layer 102 and the potential of the "additional gate electrode" in FIG. 15 are, but not limited to, equal. A wiring connected to the "additional gate electrode" may be independently formed, and the potential thereof may be different from the potential of the gate electrode formed using the first wiring layer 102.

The TFT illustrated in FIG. 15 can have extremely high field-effect mobility and an extremely high on-state current. Therefore, the switching characteristic can be favorable. By using such a TFT in a display device, a display device with high contrast ratio can be obtained. As the display device, a liquid crystal display device and an EL display device can be given.

A liquid crystal display device is manufactured by processing the above-described active-matrix substrate in a cell process and a module process. An example of the cell process and the module process will be described below.

In the cell process, the active-matrix substrate manufactured through the above-described steps and a substrate counter to the active-matrix substrate (hereinafter referred to as a counter substrate) are attached to each other and liquid crystal is injected therebetween. First, a method for manufacturing the counter substrate will be briefly described below.

First, a light-blocking layer is formed over a substrate; a color filter layer for any of red, green, and blue is formed over the light-blocking layer; a counter electrode layer is formed over the color filter layer; and then, a rib is formed over the counter electrode layer.

The light-blocking layer is selectively formed using a material having a light-blocking property. As the material having a light-blocking property, for example, an organic resin containing a black resin (carbon black) or a material containing chromium as its main component (chromium, chromium oxide, or chromium nitride) may be used. In order to selectively form a film of a material having a light-blocking property, a photolithography method or the like may be employed.

The color filter layer may be selectively formed using a material that can transmit only any one of red light, green light, and blue light when irradiated with white light, and may be selectively formed by being separately colored. The arrangement of the color filter layer may be a stripe arrangement, a delta arrangement, or a square arrangement.

The counter electrode layer over the counter substrate may be formed over the entire surface of the counter substrate with the use of the material and method similar to those for the pixel electrode layer included in the active-matrix substrate.

The rib over the counter electrode layer is formed in order to widen the viewing angle, and is selectively formed using an organic resin material. The rib may be formed as needed.

Further, after formation of the color filter layer and before formation of the counter electrode layer, an overcoat layer may be formed. By forming the overcoat layer, a surface over which the counter electrode layer is to be formed can be flattened more, and entry of part of the materials contained in the color filter layer into a liquid crystal material can be prevented. For the overcoat layer, a thermosetting material containing acrylic resin or epoxy resin as a base is used.

Note that before or after formation of the rib, a post spacer (a columnar spacer) may be formed as a spacer. In the case of using a bead spacer (a spherical spacer), the post spacer does not need to be formed.

Next, an alignment film is formed on each of the active-matrix substrate and the counter substrate. The alignment film is formed, for example, in such a manner that a polyimide resin or the like is melted in an organic solvent; this solution is applied by a printing method, a spin coating method, or the like; and then the organic solvent is removed and the substrate is baked. Rubbing treatment is preferably performed on the alignment film so that liquid crystal molecules are aligned with a certain pretilt angle. The rubbing treatment may be performed, for example, by rubbing the alignment film with a cloth having long fibers such as velvet.

Then, the active-matrix substrate and the counter substrate are attached to each other with a sealant. In the case where the bead spacer is used, it is preferable that the bead spacer be dispersed in a desired region and the attachment be performed.

Next, a liquid crystal material is injected in a space between the active-matrix substrate and the counter substrate, which are attached to each other. After injection of the liquid crystal material, an inlet for injection is sealed with an ultraviolet curing resin or the like. Alternatively, after dropping a liquid crystal material on either the active-matrix substrate or the counter substrate, these substrates may be attached to each other.

Next, polarizing plates are attached to both surfaces of a liquid crystal cell, which is formed by attachment of the active-matrix substrate and the counter substrate. Then, the cell process is finished.

Next, as the module process, a flexible printed circuit (FPC) is connected to an input terminal of a terminal portion. The FPC has a wiring formed using a conductive Film over an organic resin film of polyimide or the like, and is connected to the input terminal through an anisotropic conductive paste (ACP). The ACP includes a paste functioning as an adhesive and particles which have a conductive surface by being plated with gold or the like and which have a diameter of several tens of micrometers to several hundreds of micrometers. When the particles mixed in the paste are in contact with the conductive layer over the input terminal and the conductive layer over the terminal connected to the wiring formed in the FPC, electric connection therebetween is realized. Alternatively, after connection of the FPC, a polarizing plate may be attached to the active-matrix substrate and the counter substrate.

In the above manner, the liquid crystal display device can be manufactured.

Note that as the liquid crystal material, a liquid crystal exhibiting a blue phase may be used. The blue phase is a kind of liquid crystal phase and appears just before phase transition from a cholesteric phase to an isotropic phase when the temperature of a cholesteric liquid crystal is increased. Since the blue phase is only generated within a narrow range of temperature, a liquid crystal composition containing a chiral agent at 5 wt % or more is used in order to increase the temperature range. The liquid crystal composition which includes a liquid crystal material exhibiting a blue phase and a chiral agent has a short response time of 10 μs to 100 μs, has optical isotropy, which makes the alignment process unneeded, and has a small viewing angle dependence.

Alternatively, the display device of this embodiment may be an EL display device. In the case where the display device of this embodiment is an EL display device, an EL layer may be formed over the pixel electrode layer 706 and an additional pixel electrode layer may be formed over the EL layer.

The pixel electrode layer 706 that is formed in the above-described manner can serve as an anode; therefore, the additional pixel electrode layer that serve as a cathode may be formed using a material having a low work function (e.g., Ca, Al, MgAg, or AlLi).

The EL layer may be a single layer or a stacked-layer film in which a plurality of layers is stacked, and includes at least a light-emitting layer. It is preferable that the light-emitting layer be connected to the additional pixel electrode layer through a hole-transport layer.

Note that the EL display device of this embodiment may be of a top emission type, a bottom emission type, or a dual emission type.

Although the array substrate in which the TFT illustrated in FIG. 1 is used is described in this embodiment, without limitation to this TFT, any of the TFTs illustrated in FIG. 2, FIG. 3, FIG. 4, and FIG. 5 may also be used.

(Embodiment 4)

The TFT and the display device described in Embodiment 3 can be applied to a variety of electronic devices (including game machines). Examples of the electronic devices include a television set (also referred to as a television or a television receiver), a monitor of a computer, an electronic paper, a digital camera, a digital video camera, a digital photo frame, a cellular phone set (also referred to as a cellular phone or a cellular phone device), a portable game machine, a portable information terminal, an audio replay device, a large-sized game machine such as a pachinko machine, and the like.

The display device described in Embodiment 3 can be applied to an electronic paper, for example. The electronic paper can be used for electronic devices of a variety of fields for displaying data. For example, the electronic paper can be used for electronic book devices (e-books), posters, advertisements in vehicles such as trains, display of data on a variety of cards such as credit cards, and so on.

Figure 16A:
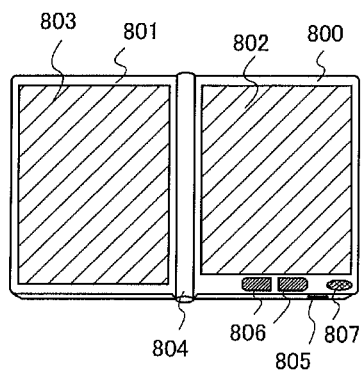
FIGS. 16A to 16D each illustrate an electronic device of Embodiment 4.

FIG. 16A illustrates an example of the electronic book devices. The electronic book device illustrated in FIG. 16A includes housings 800 and 801. The housings 800 and 801 are combined with a hinge 804 so that the electronic book device can be opened and closed, and can be handled like a paper book.

A display portion 802 is incorporated in the housing 800, and a display portion 803 is incorporated in the housing 801. The display portion 802 and the display portion 803 may be configured to display one image divided or different images. In the structure where different images are displayed, for example, the right display portion (the display portion 802 in FIG. 16A) can display text and the left display portion (the display portion 803 in FIG. 16A) can display images. The display device described in Embodiment 3 can be applied to the display portions 802 and 803.

In FIG. 16A, the housing 800 is provided with a power input terminal 805, operation keys 806, a speaker 807, and the like. The operation key 806 may have, for example, a function of turning pages. Note that a keyboard, a pointing device, or the like may be provided on the surface of the housing, on which the display portion is provided. Further, an external connection terminal (an earphone terminal, a USB terminal, a terminal that can be connected to various cables such as a USB cable, or the like), a recording medium insertion portion, and the like may be provided on the back surface or the side surface of the housing. Note that the electronic book device illustrated in FIG. 16A may further have a structure with which data can be sent and received wirelessly.

Figure 16B:
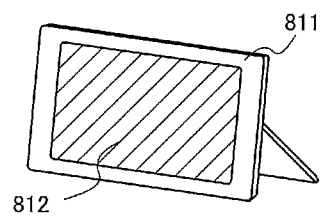

FIG. 16B illustrates an example of a digital photo frame. In the digital photo frame illustrated in FIG. 16B, a display portion 812 is incorporated in a housing 811. The display device described in Embodiment 3 can be applied to the display portion 812.

Note that the digital photo frame illustrated in FIG. 16B may be provided with an operation portion, an external connection terminal (a USB terminal, a terminal that can be connected to various cables such as a USB cable, or the like), a recording medium insertion portion, and the like. Although they may be provided on the surface on which the display portion is provided, it is preferable to provide them on the side surface or the back surface for the design of the digital photo frame. For example, a storage medium having image data taken with a digital camera is inserted into the storage medium inserting portion of the digital photo frame and the image data is imported, whereby the imported image data can be displayed On the display portion 812. The digital photo frame illustrated in FIG. 16B may be configured to transmit and receive data wirelessly.

Figure 16C:
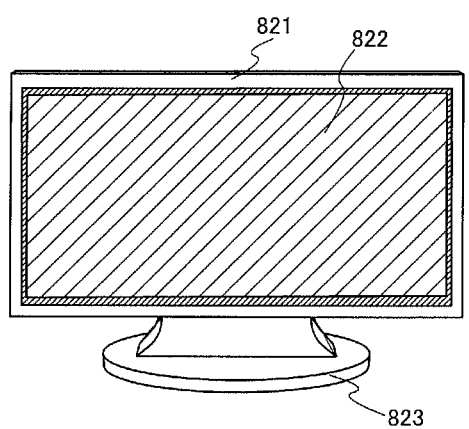

FIG. 16C illustrates an example of a television set. In the television set illustrated in FIG. 16C, a display portion 822 is incorporated in a housing 821, and the housing 821 is supported by a stand 823. The display device described in Embodiment 3 can be applied to the display portion 822.

The television set illustrated in FIG. 16C can be operated with an operation switch of the housing 821 or a separate remote controller. Channels and volume can be controlled by operation keys of the remote controller, so that images displayed on the display portion 822 can be selected. Further, the remote controller may be provided with a display portion for displaying data output from the remote controller.

Note that the television set illustrated in FIG. 16C is provided with a receiver, a modem, and the like. With the receiver, a general television broadcast can be received. Further, when the television set is connected to a communication network by wired or wireless connection via the modem, one-way (from a transmitter to a receiver) or two-way (between a transmitter and a receiver, between receivers, or the like) data communication can be performed.

Figure 16D:
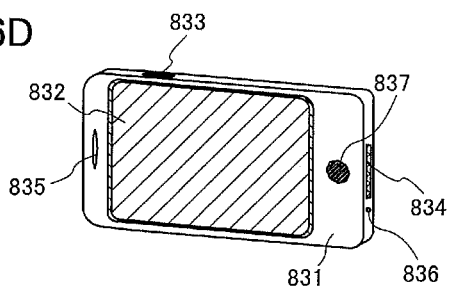

FIG. 16D illustrates an example of a cellular phone set. The cellular phone set illustrated in FIG. 16D is provided with a display portion 832 incorporated in a housing 831, operation buttons 833 and 837, an external connection port 834, a speaker 835, a microphone 836, and the like. The display device described in Embodiment 3 can be applied to the display portion 832.

The display portion 832 of the cellular phone set illustrated in FIG. 16D may be a touch panel. In the case where the display portion 832 is a touch panel, making a call, composing a mail, and the like can be performed by using the display portion 832 as a touch panel.

There are mainly three screen modes for the display portion 832. The first mode is a display mode mainly for displaying images. The second mode is an input mode mainly for inputting data such as text. The third mode is a display-and-input mode in which two modes of the display mode and the input mode are combined.

For example, in the case of making a call or composing a mail, a text input mode mainly for inputting text is selected for the display portion 832 so that text displayed on the screen can be input. In that case, it is preferable to display a keyboard or number buttons on a large area of the screen of the display portion 832.

When a detection device including a sensor for detecting inclination, such as a gyroscope or an acceleration sensor, is provided inside the cellular phone set illustrated in FIG. 16D, display data for the display portion 832 can be automatically switched depending on the orientation of the cellular phone set (whether the cellular phone set is placed horizontally or vertically for a landscape mode or a portrait mode).

The screen modes may be switched by touching the display portion 832 or operating the operation button 837 of the housing 831. Alternatively, the screen modes may be switched depending on the kind of the image displayed on the display portion 832.

In the input mode, when input by touching the display portion 832 is not performed for a specified period of time while a signal detected by an optical sensor in the display portion 832 is detected, the screen mode may be controlled so as to be switched from the input mode to the display mode.

The display portion 832 can also function as an image sensor. For example, an image of a palm print, a fingerprint, or the like is taken by the image sensor by touching the display portion 832 with a palm or a finger, whereby personal authentication can be performed. Further, by providing a backlight or a sensing light source emitting near-infrared light for the display portion, an image of a finger vein, a palm vein, or the like can be taken.

As describe above, the TFT and the display device described in Embodiment 3 can be applied to a variety of electronic devices.

This application is based on Japanese Patent Application serial no. 2009-289840 filed with Japan Patent Office on Dec. 21, 2009, the entire contents of which are hereby incorporated by reference.

What is claimed is:

1. A thin film transistor comprising:
a first semiconductor layer a part of which serves as a channel formation region;
a second semiconductor layer containing an amorphous semiconductor over the first semiconductor layer; and
an impurity semiconductor layer over the second semiconductor layer,
wherein the second semiconductor layer includes at least a first side surface, a second side surface, and a third side surface connected continuously,
wherein the second side surface is provided between the first side surface and the third side surface, and
wherein a taper angle of the first side surface, a taper angle of the second side surface, and a taper angle of the third side surface are different from one another in a cross section.

2. The thin film transistor according to claim 1, wherein the first semiconductor layer includes a crystalline semiconductor.

3. The thin film transistor according to claim 1, wherein the second semiconductor layer serves as a buffer layer.

4. The thin film transistor according to claim 1, wherein the first semiconductor layer includes columnar or needle-like crystals.

5. The thin film transistor according to claim 1, wherein a step portion is formed by the first side surface, the second side surface, and the third side surface.

6. The thin film transistor according to claim 1, wherein the second semiconductor layer contains at least one of halogen, nitrogen, an NH group, and an $NH_2$ group.

7. The thin film transistor according to claim 1, wherein the first semiconductor layer includes a crystalline semiconductor.

8. The thin film transistor according to claim 1, wherein the first semiconductor layer includes columnar or needle-like crystals.

9. The thin film transistor according to claim 1, wherein a step portion is formed by the first side surface, the second side surface, and the third side surface.

10. A thin film transistor comprising:
a first semiconductor layer a part of which serves as a channel formation region; and
a second semiconductor layer containing an amorphous semiconductor over the first semiconductor layer; and
an impurity semiconductor layer over the second semiconductor layer,
wherein the second semiconductor layer includes at least a first side surface, a second side surface, and a third side surface connected continuously,
wherein the second side surface is provided between the first side surface and the third side surface, and
wherein a taper angle of the first side surface and a taper angle of the third side surface are different from each another in a cross section.

11. The thin film transistor according to claim 10, wherein the first semiconductor layer includes a crystalline semiconductor.

12. The thin film transistor according to claim 10, wherein the second semiconductor layer serves as a buffer layer.

13. The thin film transistor according to claim 10, wherein the first semiconductor layer includes columnar or needle-like crystals.

14. The thin film transistor according to claim 10, wherein a step portion is formed by the first side surface, the second side surface, and the third side surface.

15. The thin film transistor according to claim 10, wherein the second semiconductor layer contains at least one of halogen, nitrogen, an NH group, and an $NH_2$ group.

16. A thin film transistor comprising:
a wiring layer over a substrate;
an insulating layer over the wiring layer;
a first semiconductor layer a part of which serves as a channel formation region over the insulating layer; and
a second semiconductor layer containing an amorphous semiconductor over the first semiconductor layer; and
an impurity semiconductor layer over the second semiconductor layer,
wherein the second semiconductor layer includes at least a first side surface, a second side surface, and a third side surface connected continuously,
wherein the second side surface is provided between the first side surface and the third side surface, and
wherein a taper angle of the first side surface and a taper angle of the third side surface are different from each another in a cross section.

17. The thin film transistor according to claim 16, wherein the first semiconductor layer includes a crystalline semiconductor.

18. The thin film transistor according to claim 16, wherein the second semiconductor layer serves as a buffer layer.

19. The thin film transistor according to claim 16, wherein the first semiconductor layer includes columnar or needle-like crystals.

20. The thin film transistor according to claim 16, wherein a step portion is formed by the first side surface, the second side surface, and the third side surface.

21. The thin film transistor according to claim 16, wherein the second semiconductor layer contains at least one of halogen, nitrogen, an NH group, and an $NH_2$ group.

22. A thin film transistor comprising:
a first semiconductor layer a part of which serves as a channel formation region; and
a second semiconductor layer containing an amorphous semiconductor over the first semiconductor layer,
wherein the second semiconductor layer includes at least a first side surface, a second side surface, and a third side surface connected continuously,
wherein the second side surface is provided between the first side surface and the third side surface,
wherein a taper angle of the first side surface and a taper angle of the third side surface are different from each another in a cross section, and
wherein the second semiconductor layer contains at least one of halogen, nitrogen, an NH group, and an $NH_2$ group.

* * * * *

UNITED STATES PATENT AND TRADEMARK OFFICE
CERTIFICATE OF CORRECTION

PATENT NO. : 9,202,929 B2
APPLICATION NO. : 12/972859
DATED : December 1, 2015
INVENTOR(S) : Yasuhiro Jinbo et al.

It is certified that error appears in the above-identified patent and that said Letters Patent is hereby corrected as shown below:

Specification

Column 5; Line 15; after "that" insert --is--.

Column 9; Line 21; delete "." after "an".

Column 15; Line 63; after "FIG." replace "I" with --1--.

Column 18; Line 40; replace "Film" with --film--.

Column 20; Line 21; replace "On" with --on--.

Claims

Column 22; Line 13; replace "laver" with --layer--.

Signed and Sealed this
Sixteenth Day of August, 2016

Michelle K. Lee
*Director of the United States Patent and Trademark Office*